United States Patent [19]

Kubota et al.

[11] Patent Number: 4,670,981

[45] Date of Patent: Jun. 9, 1987

[54] METHOD OF MOUNTING ELECTRONIC PARTS ON THE PREDETERMINED POSITIONS OF A PRINTED CIRCUIT BOARD

[75] Inventors: Shigeru Kubota, Tokyo; Shoji Kanou, Yokohama; Masahiro Kubo, Machida, all of Japan

[73] Assignee: Nitto Kogyo Kabushiki Kaisha, Tokyo, Japan

[21] Appl. No.: 834,924

[22] Filed: Feb. 28, 1986

[51] Int. Cl.⁴ .............................................. H05K 3/39
[52] U.S. Cl. ........................................ 29/840; 29/407; 29/834; 33/613; 33/614; 228/6.2
[58] Field of Search ................. 29/840, 407, 467, 464, 29/834; 228/6.2; 33/180 R, 184.5

[56] References Cited

U.S. PATENT DOCUMENTS

| | | | |
|---|---|---|---|
| 3,868,759 | 3/1975 | Hartleroad et al. | 29/464 |
| 3,887,997 | 6/1975 | Hartleroad et al. | 228/6.2 X |
| 3,982,979 | 9/1976 | Hentz et al. | 29/834 X |
| 4,116,348 | 9/1978 | Atehley et al. | 29/771 X |
| 4,342,090 | 7/1982 | Caccoma et al. | 29/834 X |
| 4,386,464 | 6/1983 | Yanai et al. | 29/834 |
| 4,393,579 | 7/1983 | Van Hooreweber | 29/834 X |
| 4,437,232 | 3/1984 | Araki et al. | 228/6.2 X |
| 4,451,324 | 5/1984 | Ichikawa et al. | 29/834 X |
| 4,476,626 | 10/1984 | Gumbert et al. | 29/834 X |
| 4,480,780 | 11/1984 | Claeskens et al. | 29/834 X |
| 4,610,388 | 9/1986 | Koltuniak et al. | 228/6.2 |
| 4,615,093 | 10/1986 | Tews et al. | 29/407 |

FOREIGN PATENT DOCUMENTS 2063227  6/1981  United Kingdom .................. 29/834

*Primary Examiner*—Howard N. Goldberg
*Assistant Examiner*—Carl J. Arbes
*Attorney, Agent, or Firm*—Oblon, Fisher, Spivak, McClelland & Maier

[57] ABSTRACT

A method of mounting electronic parts on the predetermined positions of a printed circuit board is disclosed which is capable of simultaneously correcting the misregistration of a plurality of electronic parts by one cycle of operations so as to precisely position and mount the electronic parts on the printed circuit board. In the present invention, the misregistration of individual electronic parts with respect to suction tubes of a suction head in an automatic chip-mounting apparatus is corrected at the time when the suction tubes suck up the electronic parts from the cavities of the jig in which the electronic parts are charged to thereby place each of the suction tubes on the predetermined or exact suction position of the electronic parts or align the center of each of the electronic parts with that of the corresponding suction tube.

5 Claims, 9 Drawing Figures

FIG. 1(a)
FIG. 1(b)
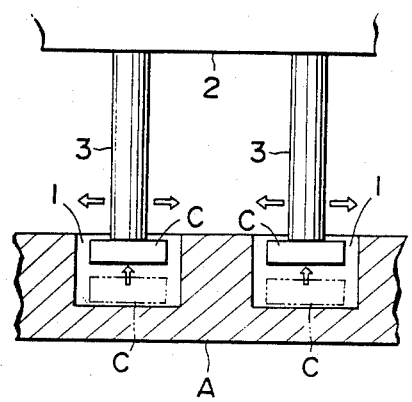
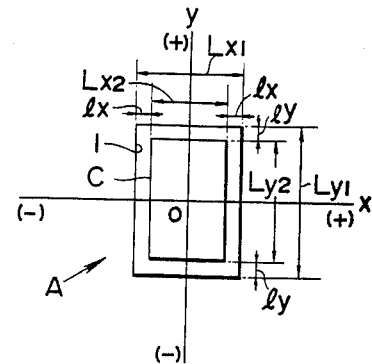
FIG.2(a) FIG.2(b) FIG.2(c) FIG.2(d)
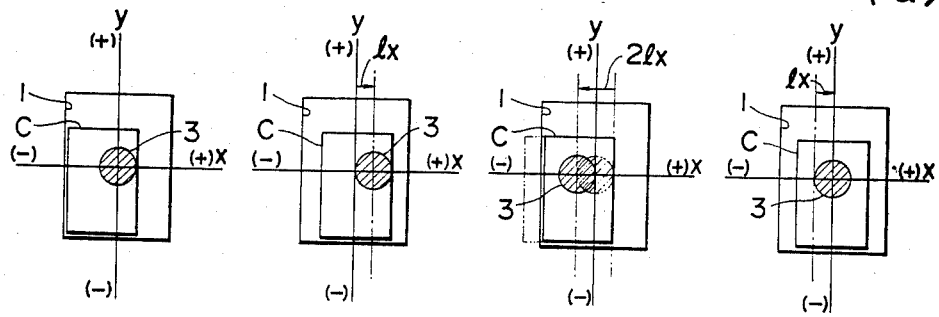
FIG.2(e) FIG.2(f) FIG.2(g)
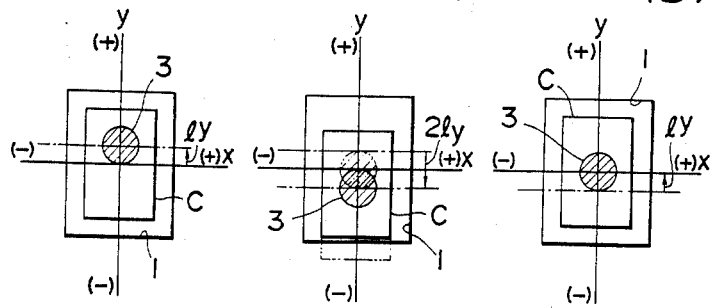

METHOD OF MOUNTING ELECTRONIC PARTS ON THE PREDETERMINED POSITIONS OF A PRINTED CIRCUIT BOARD

BACKGROUND OF THE INVENTION

1. Field of the Invention

This invention relates to a method of mounting electronic parts on the predetermined positions of a printed circuit board, and more particularly to a method of aligning the center of the electronic parts supplied in a jig with that of a suction tube of an automatic chip-mounting apparatus.

2. Description of the Prior Art

Recently, various kinds of automatic chip-mounting apparatuses have been used for automatically positioning miniaturized electronic parts of cylindrical shape, plate-like shape, disc-like shape or the like, such as, for example, resistors, capacitors or the like (hereinafter referred to as "chips") on a printed circuit board and fixedly mounting such chips thereon.

Generally, the automatic chip-mounting apparatus includes a jig having a plurality of cavities in which chips are charged. The cavities are arranged in alignment with positions of the printed circuit board on which the chips are to be mounted. The chips are fed to the cavities of the jig by a suitable means. The jig charged with the chips is shifted to a predetermined position where the chips are sucked up from the cavities onto a plurality of suction tubes provided at suction heads of the chip-mounting apparatus which are arranged in alignment with the cavities of the jig. The chips sucked up onto the suction tubes are transferred to the printed circuit board where suction is released so that the chips may fall to be precisely positioned on the printed circuit board corresponding to the arrangement of the chips in the cavities and securely adhered thereto by means of an adhesive applied onto the printed circuit board in advance. Then, the adhesive is subjected to dry and the printed circuit board having the chips mounted thereon to a soldering station so that the chips may fix on the board.

However, according to the mounting operations of the chips on the printed circuit board described above, it is extremely difficult to arrange the chips precisely on predetermined positions of the board. The chips are liable to be misregistered with respect to the printed circuit board ranging about 0.3 mm in the longitudinal direction (y-axial direction) and/or the lateral direction (x-axial direction) of the printed circuit board on a plane.

The misregistration is caused due to the inaccuracy of dimensions of individual chips. A chip has considerable variability in dimensions due to various factors occurring in the manufacturing process such as a dimensional error of the chip to be finished, a variation in dimensions of the chips caused by the work on the chip such as the coating on the chip, and the like. For example, a chip having basic dimensions of 1.25 mm×2.00 mm generally includes a dimensional error of about 0.25 mm in each direction. In order to compensate such a dimensional error of the chip, the cavities of the jig each must be formed to have a size sufficient to receive therein a chip having a maximum dimensional error of, for example, 0.25 mm and have a clearance of, for example, 0.25 mm defined around the chip received therein. In this example, the cavity must have a size of about 1.7–2.4 mm×2.4–2.5 mm.

Accordingly, the charging of the chip having basic dimensions of, for example, 1.25 mm×2.00 mm in the cavity creates a clearance of about 0.25 mm around the chip. When the chip has a dimensional error, the clearance is, of course, varied. This does not cause any problem when the chip is precisely positioned at the center of the cavity, however, the suction position of the chip is about 0.75 mm off in maximum when it is deviated from the precise position in the cavity.

On the other hand, the suction tubes of the suction head and the corresponding cavities of the jig can be mechanically designed with high accuracy to a degree sufficient to align the center of each of the suction tubes with that of the corresponding cavities on the same central line and carry out the mounting of the chips in a manner to permit the suction tube to descend to suck up the chips charged in the cavities, ascend while holding the chips thereon and then mount the chips on the predetermined position of the printed circuit board. Accordingly, when the chip is sucked up onto the suction tube at a position deviated from the predetermined or exact suction position thereof, the chip is mounted on a position of the printed circuit board deviated from the predetermined mounting position thereof resulting from the deviation of the chip in the cavity.

This misregistration of the chip is relatively easy to correct in an automatic chip-mounting apparatus of the single-mount type which is adapted to perform the sucking and mounting of chips onto the printed circuit board one by one, because the correction of the misregistration can be singly carried out. However, an automatic chip-mounting apparatus of the multi-mount type to which the present invention is directed renders the correction of the misregistration substantially impossible during the mounting operation, because it is constructed in a manner such that a plurality of suction tubes provided at the suction head such as, for example, vacuum tubings have to concurrently suck up a plurality of chips, for example, several tens to several hundreds of chips, at a time from a plurality of the cavities provided at the jig and mount them on the predetermined various positions of the printed circuit board.

Thus, the misregistration of the chip can not be eliminated by the conventional automatic chip-mounting apparatus of the multi-mount type. Accordingly, it has been attempted to decrease the misregistration by increasing the dimensional accuracy of individual chips so as to minimize the clearance of each cavity. However, this is not effective to miniaturized chips.

SUMMARY OF THE INVENTION

The present invention has been made in view of the foregoing disadvantage of the prior art while taking notice of the fact that a chance of correcting the misregistration of the chip is only during a time for which the chip is received in the cavity of the jig. According to the present invention, the misregistration of individual chips with respect to suction tubes of the suction head is corrected at the time immediately after the suction tubes suck up the chips from the cavities of the jig, to thereby place each of the suction tubes on the predetermined or exact suction position of the chips or align the center of the chips with that of the corresponding suction tube.

Accordingly, it is an object of the present invention to provide a method of correcting the suction position of a chip at a jig and a suction tube of an automatic chip-mounting apparatus which is capable of simultaneously correcting the misregistration of a plurality of chips and simultaneously positioning and mounting the chips on a printed circuit board in a simple manner with high accuracy.

It is another object of the present invention to provide a method of mounting a chip on the predetermined position of a printed circuit board by using an automatic chip-mounting apparatus.

In accordance with the present invention, there is provided a method of mounting a chip on the predetermined position of a printed circuit board comprising the steps of charging chips in each of cavities of a jig, in an automatic chip-mounting apparatus sucking up the chips in the cavities by means of the suction tubes of the suction head, upwardly moving the suction head while holding the chips on the suction tubes, lowering it onto a printed circuit board, and releasing the chips from the suction tubes to be mounted the chips on predetermined positions of the printed circuit board. In the present invention, the cavities each have an x-axial dimention $Lx1$ and a y-axial dimension $Ly1$, and chips each have an x-axial dimension $Lx2$ and a y-axial dimension $Ly2$, thereby creating positive and negative clearances $lx$ in the x-axial direction between each of the cavities and the chips and positive and negative clearances $ly$ in the y-axial direction between each of the cavities and the chips. The suction tubes are lowered so as to be inserted into the cavities and suck up the chips and then upwardly moved by a predetermined distance within the cavities. Then, the suction tubes are moved by a distance of $lx$ in each of the positive and negative x-axial directions and returned to the center of the cavities. Subsequently, the suction tubes are moved by a distance of $ly$ in each of the positive and negative y-axial directions and then returned to the center of the cavities, to thereby permit the periphery of each of the chips to collide with the inner wall of the cavity in the positive and negative x-and y-axial directions, and the center of the suction tube, chip, and cavity to align with one another due to relative motion of the suction tube with respect to the chips. The suction tubes each having the chip sucked up at the correct suction position thereon are moved onto a printed circuit board and the chips are then released from the suction tubes to be mounted the chips on predetermined positions of the printed circuit board with high precision.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference characters designate like parts throughout; wherein:

FIG. 1(a) is a schematic sectional view showing suction tubes of a suction head which have sucked up chips charged in cavities of a jig and been lifted by a predetermined distance;

FIG. 1(b) is a schematic plan view showing the dimensional relationships between a cavity of a jig and a chip charged in the cavity;

FIGS. 2(a) to 2(d) are schematic plan views showing the sequential order of moving and correcting a chip in the positive and negative x-axial direction; and FIGS. 2(e) to 2(g) are schematic plan views showing the sequential order of moving and correcting a chip in the positive and negative y-axial direction.

DETAILED DESCRIPTION OF THE PREFERRED EMBODIMENT

Now, a method of correcting the suction position of a chip at a jig and a suction tube of an automatic chip-mounting apparatus according to the present invention will be described hereinafter with reference to the accompanying drawings.

First, a suction position correcting method of the present invention will be described with reference to FIGS. 1(a) and 1(b). Briefly, the method of the present invention comprises the steps of charging chips C in cavities 1 of a jig A, sucking up the chips by means of suction tubes 3 of a suction head 2, upwardly moving the suction head 2 while holding the chips C thereon, lowering it onto a printed circuit board, and releasing the chips C from the suction tubes 3 so that the chips may be mounted on predetermined positions of the printed circuit board.

As shown in FIG. 1(b), the chip charging holes 1 each have an x-axial dimension $Lx1$ and a y-axial dimension $Ly1$, the chips C each have an x-axial dimension $Lx2$ and a y-axial dimension $Ly2$. Accordingly, the upper and lower clearances or positive and negative clearances $lx$ in the x-axial direction between the chip charging hole 1 and the chip C each are indicated by $lx$, which is equal to $(Lx1-Lx2)/2$, and the right and left clearances or positive and negative clearances $ly$ in the y-axial direction therebetween each are indicated by $ly$, which is equal to $(Ly1-Ly2)/2$.

In the method of the present invention, the suction tubes 3 are downwardly moved to be inserted into the corresponding cavities 1, to thereby suck up the chips C therefrom and then upwardly moved by a predetermined distance within the cavities 1 so as to maintain each of the chips at a predetermined position in each of the cavities while holding it thereon. These operations are carried out simultaneously with respect to all the suction tubes.

Then, all the suction tubes 3 are subjected to move in x-axial and y-axial directions horizontal to the jig A in accordance with the following sequential steps by actuating the suction head 1.

(a) First, the suction tubes 3 are moved by a distance of $lx$ in the positive x-axial direction or the right direction in FIG. 1(b).

(b) Then, the suction tubes 3 are moved by a distance of $2lx$ in the negative x-axial direction or the left direction in FIG. 1(b) from the position described above (a);

(c) The suction tubes 3 are then moved by a distance of $lx$ in the positive x-axial direction from the position (b);

(d) Then, the suction tubes 3 are moved by a distance of $ly$ in the positive y-axial direction from the position (c);

(e) Subsequently, the suction tubes 3 are moved by a distance of $2ly$ in the negative y-axial direction from the position (d); and (f) Thereafter, the suction tubes 3 are moved by a distance of $ly$ in the positive y-axial direction from the position (e) and then stopped.

In other words, all the suction tubes 3 each having its center positioned on the center line of the corresponding cavity 1 are moved by a distance of $lx$ in each of the positive and negative x-axial directions and then returned to the original position. Further, the suction tubes 3 are moved by a distance of ly in each of the positive and negative y-axial directions and then returned to the original position. The movement of the suction tubes 3 in both x-axial and y-axial directions by a distance corresponding to each of the clearances causes the periphery of each of the chips to collide with the inner wall of the cavity 1, to thereby displace the suction position of the chip due to relative motion of the suction tube 3 with respect to the chip C and align the center of the each of suction tubes 3, chips C and cavities 1 with one another. Then, the suction tubes 3 each holding the chip C at the correct suction position thereof are moved onto a printed circuit board, and then the chips C are released from the suction tubes and mounted on the predetermined positions of the printed circuit board.

The method of the present invention described above can obtain satisfactory results when the following preconditions are satisfied.

(1) The cavities 1 are formed to have the same dimensions in respect of each of the chips C to be charged in the cavities. This can be readily accomplished using conventional precision machining techniques.

(2) The center of each of the suction tubes 3 is aligned with that of the corresponding cavity 1 and the predetermined position of the printed circuit board on which the chip is to be mounted.

(3) The clearances lx and ly are determined based on the basic dimensions of the chip C, and the positive and negative allowable dimensional errors of each of the chips are neglected.

Accordingly, if there is a dimensional error in the chip, the center of the suction tube can not be exactly agreed or aligned with the center of the chip and the alignment between the suction tube and the chip is "apparent alignment". Nevertheless, the misregistration of the chip due to the apparent alignment is one tenth to one hundred less than that in the prior art.

Now, the method of the present invention will be described more detailedly in connection with an example shown in FIGS. 2(a) to 2(g).

In the example shown in FIG. 2, the chip C is determined to have dimensions of 1.25 mm×2.00 mm and the cavity 1 has dimensions of 1.75 mm×2.50 mm. Accordingly, each of the positive and negative clearances in each of the x- and y-axial directions is 0.25 mm when the chip C is positioned at the center of the cavity. In the example shown in FIG. 2, the chip C is charged in the cavity 1 in to be deviated from the center to the lower corner on the left side of the hole as shown in FIG. 2(a). The method of aligning the center of the suction tube with that of the chip is effected as follows:

(a) First, the suction tube 3 is moved by a distance of 0.25 mm (lx) in the positive x-axial direction as shown in FIG. 2(b). In this case, the chip C does not collide with the inner wall of the cavity because the clearance in this direction is above 0.25 mm.

(b) Then, the suction tube 3 is moved by a distance of 0.5 mm (2lx) in the negative x-axial direction from the position (a) described above or that shown in FIG. 2(b). This causes the chip C to collide with the inner wall of the cavity when the chip C is moved by a distance of 0.25 mm, and the movement of the chip C is stopped and only the suction tube 3 is forcibly moved by the distance of 0.5 mm. Accordingly, the suction position of the suction tube 3 with respect to the chip C is moved due to relative motion, to thereby agree or align the center of the chip C on the x-axis thereof with that of the suction tube 3 as shown in FIG. 2(c).

(c) When the suction tube 3 is moved or returned by 0.25 mm (lx) in the positive x-axial direction from the position (b), this causes the x-axial centers of the suction tube 3, chip C and chip charging hole 1 to be agreed or aligned with one another as shown in FIG. 2(d).

(d) Then, the suction tube 3 is moved by a distance of 0.25 mm (ly) in the positive y-axial direction from the position (c) or that shown in FIG. 2(d). This movement does not cause the collision between the chip C and the inner wall of the cavity 1 as shown in FIG. 2(e), because the clearance in this direction is above 0.25 mm.

(e) Subsequently, the suction tube 3 is moved by 0.5 mm (2ly) in the negative y-axial direction from the position (d). This causes the chip C to collide with the inner wall of the cavity when the chip C is moved by a distance of 0.25 mm, and the movement of the chip C is stopped and only the suction tube 3 is forcibly moved by the distance of 0.5 mm. Accordingly, the suction position of the suction tube 3 with respect to the chip C is moved due to relative motion, to thereby agree or align the center of the chip C on the y-axis thereof with that of the suction tube 3 as shown in FIG. 2(f).

(f) Thereafter, the suction tube 3 is returned by a distance of 0.25 mm in the positive y-axial direction from the position (e) or that shown in FIG. 2(f). This results in the center of the suction tube 3, chip C and cavity 1 being aligned with one another on the y-axial direction as shown in FIG. 2(g).

Thus, it will be noted that the operations (a)–(f) described above cause the center of the suction tube 3, chip C and cavity 1 in the x- and y-axial directions to be exactly coincided or aligned with one another, and the misalignment of the chip C which has been deviated from a predetermined or exact suction position thereof is corrected to the exact position.

The above operations are carried out simultaneously with respect to all the suction tubes corresponding to the cavities of the jig. More particularly, in the method of the present invention, the movements in the positive and negative x- and y-axial directions each are simultaneously carried out with respect to all the suction tubes, and one cycle of the operations permits all the sucked-up chips to be simultaneously corrected in suction position and mounted on the predetermined mounting positions of the printed circuit board with high precision.

The method of the present invention is to suck up chips charged in the cavities of the jig by means of the suction tubes, move the suction tubes to the printed circuit board while holding the chips thereon and mount the chips on the printed circuit board. Accordingly, any suitable means can be used for feeding chips one by one to the cavities, such as, for example, a chip feeder for feeding the chip through a chip feeding pipe, a chip feeding magazine, a chip feeding tape and the like.

While a preferred embodiment of the invention has been described with a certain degree of particularity with reference to the drawings, obvious modifications and variations are possible in the light of the above teachings. It is therefore to be understood that within the scope of the appended claims, the invention may be practiced otherwise than as specifically described.

What is claimed as new and desired to be secured by Letters Patents of the United States is:

1. A method of mounting electronic parts on the predetermined positions of a printed circuit board comprising the steps of:

charging said electronic parts in each of cavities of a jig in an automatic chip-mounting apparatus, said cavities each having an x-axial dimension Lx1 and a y-axial dimension Ly1, said electronic parts each having an x-axial dimension Lx2 and a y-axial dimension Ly2, thereby creating a first and second clearances lx in the x-axial direction between each of said cavities and said electronic parts and a first and second clearances ly in the y-axial direction between each of said cavities and said electronic parts;

sucking up said electronic parts in said cavities by means of suction tubes in said automatic chip-mounting apparatus;

moving said suction tubes upwardly within said cavities while holding said electronic parts on said suction tubes;

moving said suction tubes in a first and second x-axial directions;

returning said suction tubes to the center of said cavities by moving said suction tubes in the x-axial direction;

moving said suction tubes in a first and second y-axial directions;

returning said suction tubes to the center of said cavities by moving said suction tubes in the y-axial direction, thereby permitting each of said electronic parts to collide with the inner wall of said cavity in the first and second x- and y-axial directions and permitting the center of said suction tube, electronic part and cavity to align with one another due to relative motion of said suction tube with respect to said electronic parts;

moving said suction tubes each having said electronic parts sucked up aligning the center of said electronic parts with that of said cavities onto said printed circuit board; and releasing said electronic parts from said suction tubes to be mounted on the predetermined positions of said printed circuit board.

2. The method of mounting electronic parts on the predetermined position of a printed circuit board as defined in claim 1, wherein each of said first and second clearances in the x-axial direction is represented by the expression of $Lx1 - Lx2/2$.

3. The method of mounting electronic parts on the predetermined position of a printed circuit board as defined in claim 1 or 2, wherein each of said first and second clearances in the y-axial direction is represented by the expression of $Ly1 - Ly2/2$.

4. The method of mounting electronic parts on the predetermined position of a printed circuit board as defined in claim 1, wherein said suction tubes are moved by a distance equivalent to said clearance lx in the first x-axial direction and then moved by a distance equivalent to two times as much as said clearance lx in the second x-axial direction.

5. The method of mounting electronic parts on the predetermined position of a printed circuit board as defined in claim 1, wherein said suction tubes are moved by a distance equivalent to said clearance ly in the first y-axial direction and then moved by a distance equivalent to two times as much as said clearance ly in the second y-axial direction.

* * * * *